US010600905B1

(12) United States Patent
Venkatraman et al.

(10) Patent No.: US 10,600,905 B1
(45) Date of Patent: Mar. 24, 2020

(54) TRENCH MOSFET CONTACTS

(71) Applicant: SEMICONDUCTOR COMPONENTS INDUSTRIES, LLC, Phoenix, AZ (US)

(72) Inventors: Prasad Venkatraman, Gilbert, AZ (US); Dean E. Probst, West Jordan, UT (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 15 days.

(21) Appl. No.: 16/128,139

(22) Filed: Sep. 11, 2018

(51) Int. Cl.
*H01L 29/78* (2006.01)
*H01L 29/66* (2006.01)
*H01L 29/417* (2006.01)

(52) U.S. Cl.
CPC .... *H01L 29/7813* (2013.01); *H01L 29/41766* (2013.01); *H01L 29/66734* (2013.01)

(58) Field of Classification Search
None
See application file for complete search history.

(56) References Cited

U.S. PATENT DOCUMENTS

| 8,362,548 B2 * | 1/2013 | Burke | H01L 29/407 257/330 |
| 2010/0123192 A1 * | 5/2010 | Burke | H01L 29/407 257/334 |
| 2011/0220990 A1 * | 9/2011 | Chang | H01L 29/402 257/330 |
| 2012/0098059 A1 * | 4/2012 | Tai | H01L 29/407 257/330 |
| 2012/0280307 A1 * | 11/2012 | Su | H01L 29/872 257/328 |
| 2012/0292694 A1 * | 11/2012 | Hsieh | H01L 29/407 257/331 |
| 2014/0084363 A1 * | 3/2014 | Pearse | H01L 29/407 257/330 |
| 2015/0145028 A1 * | 5/2015 | Laven | H01L 29/7813 257/330 |

* cited by examiner

*Primary Examiner* — Michelle Mandala
*Assistant Examiner* — Jordan M Klein
(74) *Attorney, Agent, or Firm* — Brake Hughes Bellermann LLP

(57) ABSTRACT

A device has an active area made of an array of first type of device cells and a gate or shield contact area made of an array of a second type of device cells that are laid out at a wider pitch than the array of first type of device cells. Each device cell in the active area includes a trench that contains a gate electrode and an adjoining mesa that contains the drain, source, body, and channel regions of the device. The second type of device cell includes a trench that is wider than the trench in the first device cell, but a mesa of the second type of device cell has about the same width as the mesa of the first type of device cell. Having about the same width, the mesa in the second type of device cell in the contact area has similar breakdown characteristics as a mesa in the first type of device cell in the active area of the device.

20 Claims, 11 Drawing Sheets

Defining a separation trench within a semiconductor region of the device with an active area of the device disposed on a first side of the separation trench, and a contact area disposed on a second side of the separation trench
610

Disposing a plurality of trenches of a first type in the active area, each trench of the first type being aligned perpendicular to and having a first longitudinal end terminating at the separation trench, and having a width in the longitudinal direction of the separation trench
620

Disposing a plurality of trenches of a second type in the contact area, each trench of the second type being aligned perpendicular to and having a first longitudinal end terminating at the separation trench, and having a width in a longitudinal direction of the separation trench
630

Disposing a number of the plurality of trenches of the second type in the contact area that is less than the number of the plurality of trenches of the first type disposed in the active area
640

Forming an active area mesa between a pair of trenches of the first type in the active area has a width that is substantially the same as the width of a gate contact area mesa formed between a pair of the trenches of the second type in the gate contact area
650

Forming a P High Voltage (PHV) body region in the contact area mesa that has a width that is substantially the same as the width of the active area mesa in the active area
660

Exposing a device source contact element in the active area mesa and coupling the device source contact element to a source contact conductive layer extending over the active area, and exposing a device body region in the contact area mesa and coupling the exposed device body region to a portion of the source contact conductive layer extending over the contact area
670

TRENCH MOSFET CONTACTS

TECHNICAL FIELD

This description relates to contacts in a shielded gate trench MOSFET.

BACKGROUND

As semiconductor device (e.g., device cell dimensions) shrink, it is increasingly difficult to make gate and shield contacts in as semiconductor device (e.g., a shield gate shielded gate trench MOSFET). Different lithography design rules may be used for active areas and contact areas of the semiconductor device. For proper device functioning, charge in the drift regions of the MOSFET has to be well controlled and balanced in both the active areas and the contact areas to avoid adversely affecting the breakdown voltage of the device.

BRIEF DESCRIPTION OF THE DRAWINGS

FIG. 6 is an illustration of an example method for making electrical contacts to active elements (e.g., gate electrodes, shield electrodes, source regions, body regions, etc.) of a trench MOSFET device.

DESCRIPTION

Figure 1A:
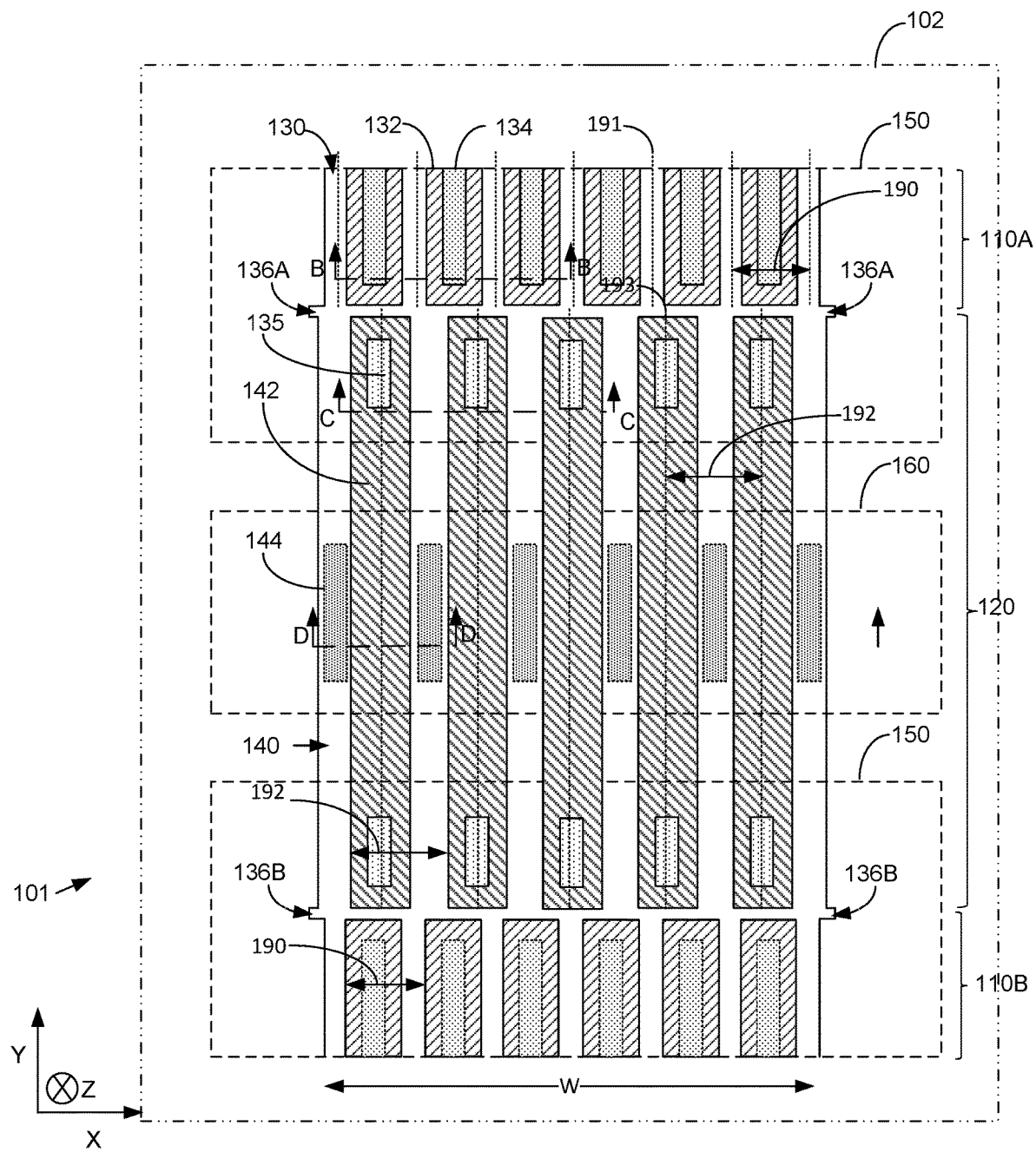
FIG. 1A is a top view of a portion of an example contact structure layout in a semiconductor region of a trench MOSFET device, in accordance with the principles of the present disclosure.

Metal oxide semiconductor field effect transistor (MOSFET) devices are used in many power switching applications. In a typical MOSFET device, a gate electrode provides turn-on and turn-off control of the device in response to an applied gate voltage. For example, in an N-type enhancement mode MOSFET, turn-on occurs when a conductive N-type inversion layer (i.e., channel region) is formed in a p-type body region in response to a positive gate voltage, which exceeds an inherent threshold voltage. The inversion layer connects N-type source regions to N-type drain regions and allows for majority carrier conduction between these regions.

In a trench MOSFET device, a gate electrode is formed in a trench that extends downward (e.g., vertically downward) from a major surface of a semiconductor material (also can be referred to as a semiconductor region) such as silicon. Further, a shield electrode may be formed below the gate electrode in the trench (and insulated via an inter-electrode dielectric). Current flow in a trench MOSFET device is primarily vertical (e.g., in an N doped drift region) and, as a result, device cells can be more densely packed. A device cell may, for example, include a trench that contains the gate electrode and an adjoining mesa that contains the drain, source, body, and channel regions of the device. An example trench MOSFET device may include an array of hundreds or thousands of device cells (each including a trench and an adjoining mesa). A device cell may be referred to herein as a trench-mesa cell because each device cell geometrically includes a trench and a mesa (or two half mesas) structures.

Packing several device cells together increases the current carrying capability and reduces on-resistance of the device. In some trench MOSFETs, P-doped regions are formed as body regions underneath the source regions alongside N-doped drift regions as a charge balancing mechanism. The charge balancing mechanism compensates the charge in the surrounding N regions under reverse bias and enables further reductions in the on-resistance of the devices.

A new generation of trench MOSFETS may have a target cell pitch that are fractions of a micron (e.g., about 0.65 µm) and a mesa width approximately half of the target cell pitch (e.g., of about 0.32 µm). However, contact lithography used for making gate, source and shield contacts is limited in resolution (e.g., limited to 180 nm). Smaller contact sizes for the new generation of MOSFETS may require use of a high resolution (e.g., 193 nm) lithography scanner, which can increase cost significantly. Further, making gate, source and shield contacts can require additional masks/process steps, which increases complexity and cost. The narrow mesa widths for the gate and shield contacts may increase charge imbalance compared to earlier generations of trench MOSFETS having wider mesa widths.

Solutions for making gate, source and shield contacts that do not require, or minimize, the use of additional masks and/or process steps are described herein. The disclosure describes contact structures that can preserve charge balance in the new generation of trench MOSFETS (even when the contact structures are fabricated using contact lithography).

In an example contact structure for a trench MOSFET device, a larger device cell pitch is used in a contact area (e.g., gate contact area, shield contact area) of the device than the device cell pitch in the active area of device. In such implementations, a trench-mesa cell in the contact area is wider than a trench-mesa cell of the active region. In example implementations, a wider trench is used in the device cell in the contact area than the trench used in the device cell in the active area to increase the cell pitch in the contact area. In some implementations, the mesa used in the device cell in the contact area may have the same width (e.g., substantially same width) or different width (e.g., wider, narrower) as the mesa used in the device cell in the active area. In some implementations, having mesas with the same width enables processing (e.g., P High Voltage (PHV) implantation) of the mesas in the contact area and the active area with a same device fabrication mask in a same processing step (e.g., implantation, diffusion).

FIG. 1A shows, in an X-Y plane of the page, a top view of a portion of an example contact structure layout 101 in a semiconductor region 102 of a trench MOSFET device 100, in accordance with the principles of the present disclosure.

Contact structure layout 101 may be used for an internal gate bus area in the body of the array of all device cells in device 100.

For convenience in description, the relative orientations or coordinates of features (e.g., trenches 130, 140) of the trench MOSFET device 100 may be described herein with reference to the X axis and Y axis shown, for example, on the page of FIG. 1A. The direction perpendicular to the X-Y plane of the page (e.g., the Z axis) may be referred to as the vertical direction or axis. Further, for visual clarity, a limited number of trenches/device cells (e.g., 6-7 trenches/device cells) of the arrays of trenches/device cells in device 100 are shown in FIG. 1A. As previously noted, an actual MOSFET device may include arrays of hundreds or thousands of trenches/device cells, which may be obtained, for example, by repeating (e.g., in the X direction) the limited array structures shown in example layout 101.

Layout 101 shows active areas 110A and 110B (collectively can be referred to as active areas 110) and a gate contact area 120 of MOSFET device 100. Each of the active areas 110 is separated from gate contact area 120 by a separation trench (e.g., separation trench 136A, 136B) (aligned with the X direction) formed in semiconductor region 102. In other words, active area 110A is disposed, for example, on a first side of separation trench (e.g., separation trench 136A) and gate contact area 120 is disposed on a second side of separation trench 136A. Active area 110A and gate contact area 120 may have a same width W (in the X direction) along separation trench 136A.

Active areas 110 includes a plurality of trenches of a first type (e.g., an array of trenches 130), each of which has a length parallel to longitudinal axis 191 (in the Y direction) and has a width (e.g., width W1$t$, FIG. 1B) aligned parallel to separation trench 136A (in the X direction). Each of the plurality of trenches 130 of the first type is aligned perpendicular to and has a first longitudinal end terminating at separation trench 136A.

Active area mesas 132 are formed between pairs of trenches 130 in the active areas 110. Each active area mesa 132 may have a width (in the X direction, e.g., width W1$m$, FIG. 1B) aligned parallel to separation trench 136A. An active area mesa 132 may include a source contact region or element 134 of device 100 that is exposed in the X-Y plane of the device.

Gate contact area 120 includes a plurality of trenches of a second type (e.g., array of trenches 140), each of which has a length parallel to longitudinal axis 193 (in the Y direction) and has a width (e.g., width W2$t$, FIG. 1C) aligned parallel to separation trench 136A (in the X direction). Each of the plurality of trenches 140 is aligned perpendicular to and has a first longitudinal end terminating at separation trench 136A. In example layout 101, each of the plurality of trenches 140 of the second type is also aligned perpendicular to another separation trench 136B and has a second longitudinal end terminating at separation trench 136B.

A trench 140 may include gate electrode structures (i.e., gate poly and gate oxide) that extend from the active area into the gate contact area. Trench 140 may include a gate electrode contact element 144 of device 100 that is exposed in the X-Y plane of the device for contacting the gate electrode structures in trench 140.

Gate contact area mesas 142 are formed between pairs of trenches 140 in gate contact area 120. Each gate contact area mesa 142 may have a width (in the X direction e.g., width W2$m$, FIG. 1C) aligned parallel to separation trench 136. A gate contact area mesa 142 may include a source or body region contact element 135 of device 100 that is exposed in the X-Y plane of the device.

In example implementations of device 100, a conductive contact layer (e.g., source metal layer 150) may overlay portions of active area 110 to establish electrical contact with source contact regions or elements 134 of device 100 that are exposed in mesas 132. Source metal layer 150 may also extend over portions of gate contact area 120 establishing electrical contact with source or body region contact elements 135 of device 100 that are exposed in mesas 142. Source metal layer 150 may be made of metal or metal alloys used for making source contacts in MOSFET devices.

Another conductive contact layer (e.g., gate metal layer 160) may overlay portions of gate contact area 120 to establish electrical contact with gate electrode contact elements 144 that are exposed in trenches 140 of device 100. Gate contact layer 160 may be made of conductive materials, for example, doped polysilicon, metal, or metal alloys.

As noted previously a device cell may, for example, include a trench and an adjoining mesa. Viewed as device cells, the array of trenches 130 and mesas 132 in active areas 110A, 110B shown in FIG. 1A may correspond to a cell pitch 190, and the array of trenches 140 and mesas 142 in gate contact area 120 shown in FIG. 1A may correspond to a cell pitch 192. In the implementation shown, cell pitch 192 in gate contact area 120 is increased and made larger than cell pitch 190 by including wider trenches (e.g. trenches 140) for making contacts, while keeping the widths of mesas 142 in gate contact area 120 to be the same as (e.g., be about the same as) the widths of mesas 132 in active area 110. As shown in FIG. 1A, because cell pitch 190 in active area 110 and cell pitch 192 in gate contact area 120 are different, the longitudinal axes (e.g., longitudinal axes 191) of trenches 130 in active area 110 are generally offset (in the X direction) from the longitudinal axes (e.g., longitudinal axes 193) of trenches 140 in gate contact area 120.

In this implementation, an integer number of device cells (N) in active areas 110 correspond to a reduced integer number (e.g., N−i) of wider device cells in the gate contact area 120. Specifically, the number of device cells in the active areas 110 over width W can be greater than the number of device cells in the gate contact area 120. The number of mesas (e.g., mesas 132) in the active areas 110 over width W can be greater than the number of mesas (e.g., mesas 142) in the gate contact area 120. The number of trenches (e.g., trenches 130) in the active areas 110 over width W can be greater than the number of trenches (e.g., trenches 140) in the gate contact area 120. In some implementations, a number of the trenches 140 in the contact area 120 on a first side of the separation trench 136A can be less than a number of the trenches 130 in the active area 110A terminating on a second side of the separation trench 136A per width W of the separation trench 136A (e.g., per unit length of the separation trench). In some implementations, a ratio of the number of the trenches in the contact area 120 terminating on one side of the separation trench 136A and the number of the trenches of the active area 110A terminating on another side of the separation trench 136A is less than one (e.g., 6/7=0.85, 5/6=0.83, 3/4=0.75, between 0.6 to 0.95).

In the example shown in FIG. 1A with (N=6, i=1), six trenches 130 (i.e. 6 device cells) in the active area correspond to five wider trenches 140 in gate contact area 120, while the widths of five mesas 142 in gate contact area 120 are kept to be about the same as the widths of six mesas 132 in active area 110. As a specific example, each device cell pitch 190 in active area 110 may, for example, be 0.65 µm (including a trench 130 width=0.18 µm and a mesa 132 width=0.47 µm). The corresponding device cell pitch 192 in gate contact area 120 is about 0.78 µm (i.e., =6/5*0.65 µm) (including a wider trench 140 width=0.31 µm and a same mesa 142 width=0.47 µm).

Keeping the mesa widths in the contact area to be the same as the mesa widths in the active area may allow fabrication of a P High Voltage (PHV) body region in the gate (and shield) contact areas, with gate oxide around gate poly, in the same manner as the fabrication of body regions in the active areas of device 100. The gate electrode structures (i.e., gate poly and gate oxide around the gate poly) in the trenches in the gate (and shield) contact areas may extend from, and be the same as, the gate electrode structures in the active areas of device 100. From a breakdown voltage perspective, the mesas in the gate contact area 120 may function the same as the mesas in the active areas 110 resulting in similar charge balance and breakdown characteristics (e.g., BVDSS) in the active and contact areas of device 100. The P High Voltage (PHV) body region in a contact area mesa may be formed using the same mask and processing step (e.g., implantation, diffusion, etc.) used to form a P High Voltage (PHV) body region in the active area mesa of the same width.

In some implementations, different integer values for N and i may be used to obtain different ratios of the number (and the widths) of trenches in the active area and contact area than in the example (N=6, i=1) shown in FIG. 1A, while keeping the mesa widths in the two areas to be about the same.

In some example implementations of layout 101, the mesa widths (e.g., W2m, FIG. 2B) in gate contact area 120 need not be exactly the same as the mesa widths (e.g., W1m, FIG. 1B) in active area 110. When a common trench etching process is used in device fabrication to form trenches in semiconductor region 102, fabricated trenches 140 (being wider than trenches 130) can be deeper than fabricated trenches 130, and fabricated inter-trench mesas 142 can be narrower than fabricated inter-trench mesas 132. In the example implementations of layout 101, the mesa widths (e.g., W2m, FIG. 2B) in gate contact area 120 may be adjusted (e.g., made narrower) to compensate for a greater depth (along the Z direction) that the wider trenches 140 are expected to have than a depth (along the Z direction) of the narrower trenches 130 in active area 110. In example implementations, such width compensation may be used, for example, to form narrower mesa structures between deeper trenches in the contact area that can have the same breakdown characteristics (e.g., after same body region formation processes) as the relatively wider mesa structures formed between the shallower trenches in the active areas of device 100.

The example layout 101 shown in FIG. 1A can be an instance of a design element that can be used within a circuit design of a device. For example, multiple instances of the example layout 101 shown in FIG. 1A can be abutted (coupled at the separation trenches 136A, 136B) and included within a device. In other words, the example layout 101 can be repeated many times within a device to form portions of the array of all device cells in the device.

Figure 1B:
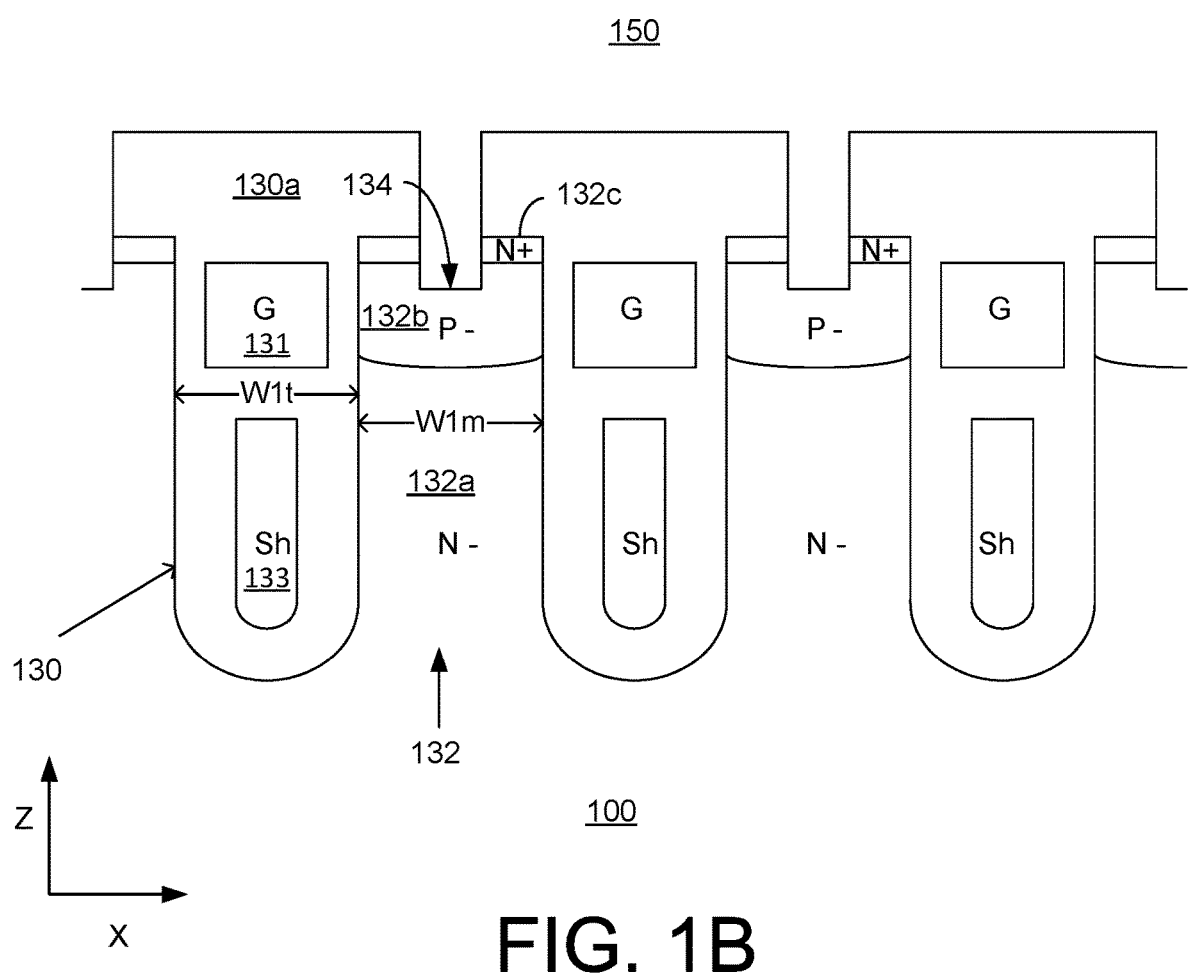
FIG. 1B is an illustration of a cross-sectional view of a portion of the device of FIG. 1A.

FIG. 1B shows a cross-sectional view of a portion of device 100 in the Z-Y plane across, for example, three trenches 130 in active area 110 (taken along line B-B in FIG. 1A). As shown in FIG. 1B, in device 100, trench 130 may include a gate electrode 131, and a shield electrode 133. Trench 130 may be filled with insulating material 130a surrounding gate electrode 131 and shield electrode 133. Further, mesas 132 (formed between pairs of trenches 130) in the active area of device 100 may include MOSFET device regions such as N– drift region 132a, P– body region 132b, and source region 132c. Mesa 132 may include exposed source contact regions or elements 134 of device 100 that are in electrical contact with source metal layer 150. As shown in FIG. 1B, trench 130 may have a width W1t, and mesa 132 may have a width W1m.

Figure 1C:
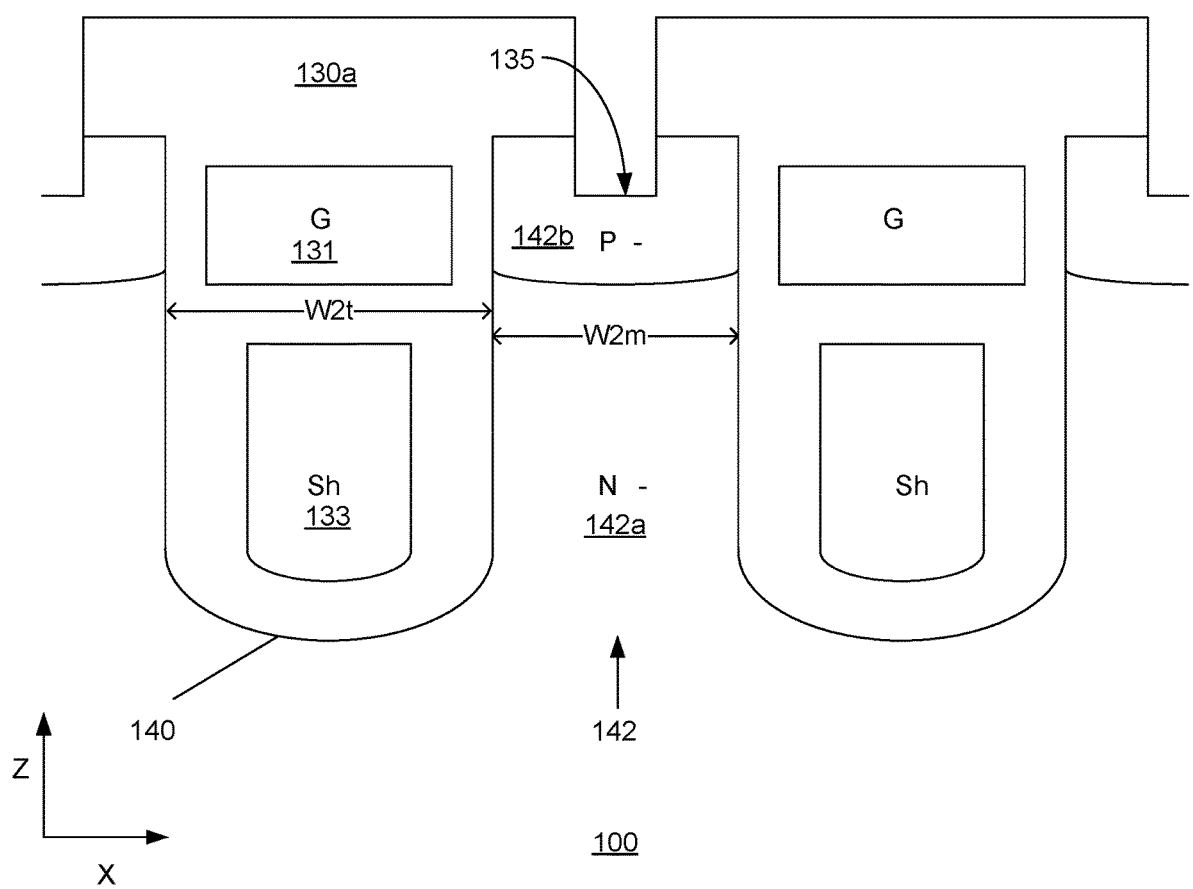
FIG. 1C is an illustration of a cross-sectional view of a portion of the device of FIG. 1A.

FIG. 1C shows a cross-sectional view of a portion of device 100 in the Z-Y plane across, for example, two trenches 140 in gate contact area 120 (taken along line C-C in FIG. 1A). As shown in FIG. 1C, in device 100, trench 140 may include a gate electrode 131, and a shield electrode 133. Trench 140 may be filled with insulating material 130a surrounding gate electrode 131 and shield electrode 133. Further, mesas 142 (formed between pairs of trenches 140) in the gate contact area of device 100 may include MOSFET device regions such as N– drift region 132a and P– body region 132b. A mesa 142 may include exposed source or body region contact element 135 of device 100 that is in electrical contact with source metal layer 150. Insulating material 130a may isolate gate electrode 131 from source metal layer 150.

As shown in FIG. 1C, trench 140 may have a width W2t, and mesa 142 may have a width W2m. In example implementations, mesa 142 width W2m may be about the same as mesa 132 width W1m (FIG. 1B), and N– drift region 142a and P– body region 142b in mesa 142 may have the same characteristics as N– drift region 132a and P– body region 132b in mesa 132 (FIG. 1B).

Figure 1D:
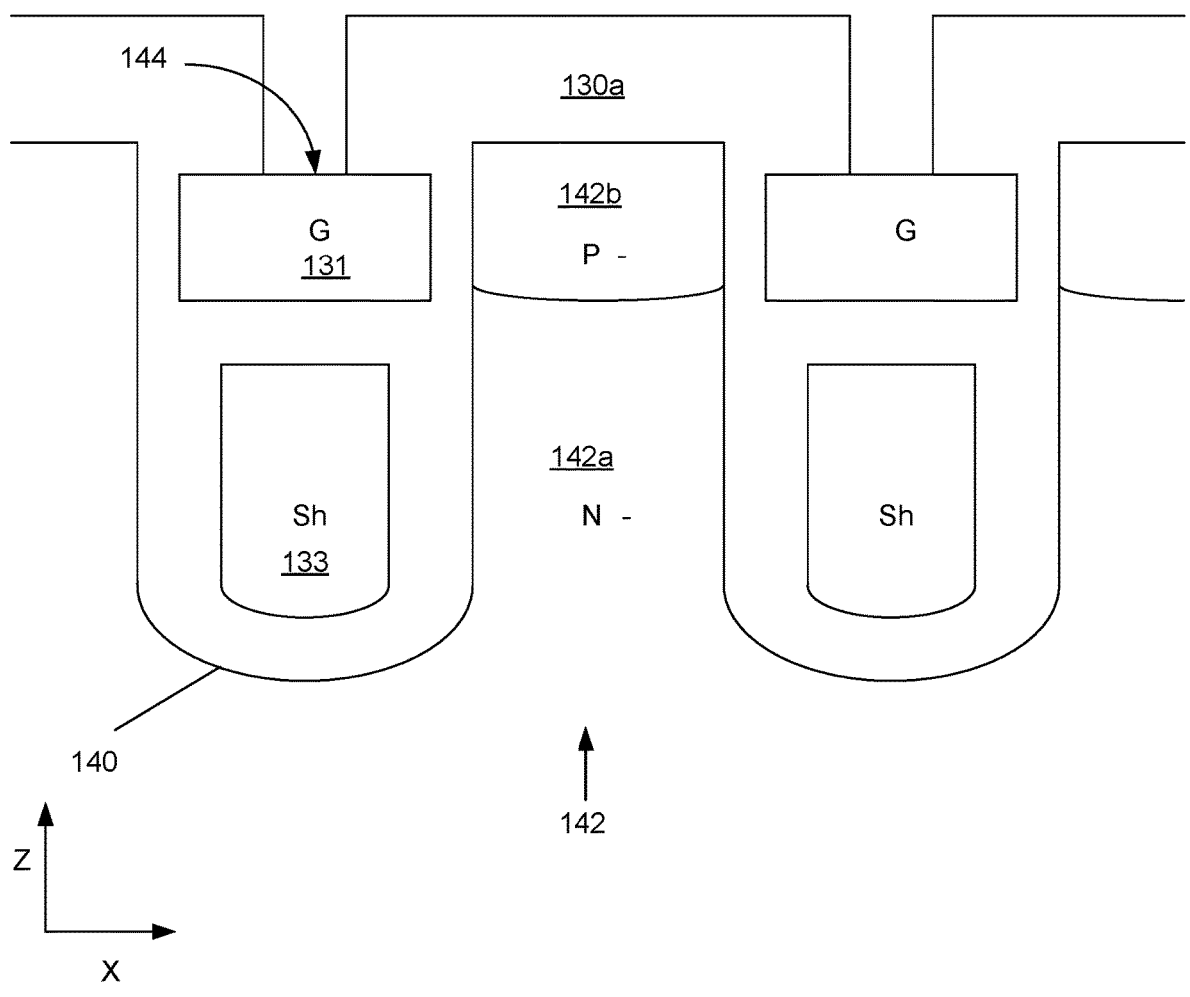
FIG. 1D is an illustration of a cross-sectional view of a portion of the device of FIG. 1A.

FIG. 1D shows a cross-sectional view of a portion of device 100 in the Z-Y plane across, for example, two trenches 140 in gate contact area 120 (taken along line D-D in FIG. 1A). As shown in FIG. 1D, in device 100, trench 140 may include a gate electrode 131, and a shield electrode 133. Trench 140 may be filled with insulating material 130a surrounding gate electrode 131 and shield electrode 133. Insulating material 130a may extend over adjoining mesa 142. A mesa 142 (formed between a pair of trenches 140) in the gate contact area 120 of device 100 may include MOSFET device regions such as N– drift region 142a and P– body region 142b.

A trench 140 may include exposed gate electrode contact element 144 of device 100. Exposed gate electrode contact element 144 may be electrically connected to gate electrodes (e.g., gates 131, FIGS. 1B through 1D) of device 100 disposed in trenches 130 in active area 110. Exposed gate electrode contact element 144 can be in electrical contact with gate metal layer 160, as shown in FIG. 1D.

In some implementations, device 100 may not include shield electrodes and gates 131 may be disposed on a thick bottom dielectric without a shield electrode in trenches 140. In some implementations, device 100 may include shield electrodes (e.g., shield electrodes 133, FIGS. 1B through 1D) disposed in trenches 140 below the gate electrodes. Contact structure layouts for shield electrodes 133 are described below with reference to FIGS. 4A through 5B.

Figure 2:
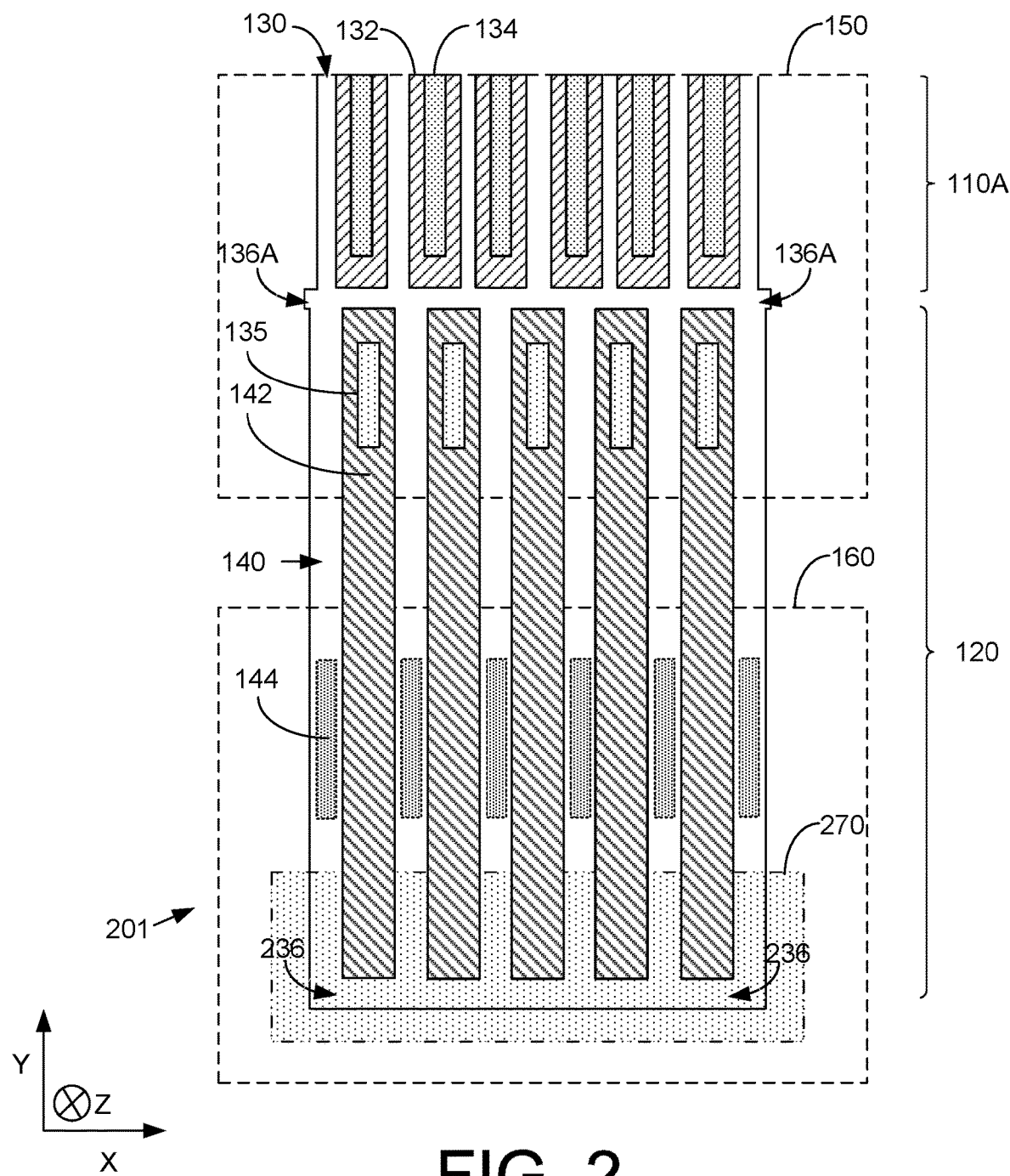
FIG. 2 is an illustration of an example contact structure layout of a device configured for external gate feed.

With renewed reference to FIG. 1A, as shown in layout 101, trenches 140 in gate contact area 120 have first longitudinal ends which terminate at separation trench 136A that has an active area 110A on the opposite side across the separation trench 136A, and have second longitudinal ends that terminate at separation trench 136B, which has another active area 110B on the opposite side across the separation trench 136B. In other words, gate contact area 120 has active areas (e.g., active areas 110A, 110B) on both longitudinal ends of trenches 140. In some implementations of device 100, other structures may be used to terminate the longitudinal ends of trenches 140 in gate contact area 120. For example, FIG. 2 shows an example contact structure layout 201 in which, like in layout 101 of FIG. 1A, first longitudinal ends of trenches 140 terminate at separation trench 136A which separates gate contact area 120 from active area 110C. However, the second longitudinal ends of trenches 140 terminate at a gate termination trench 236 that does not have an active area on the other side. Comparing FIG. 2 and FIG. 1A, gate contact area 120 is adjacent to a single active area 110A of device 100 in layout 201, while in layout 101 (FIG. 1A) gate contact area 120 is between (e.g., disposed between) two active areas 110 (e.g., active areas 110A, 110B) of device 100.

Figure 3:
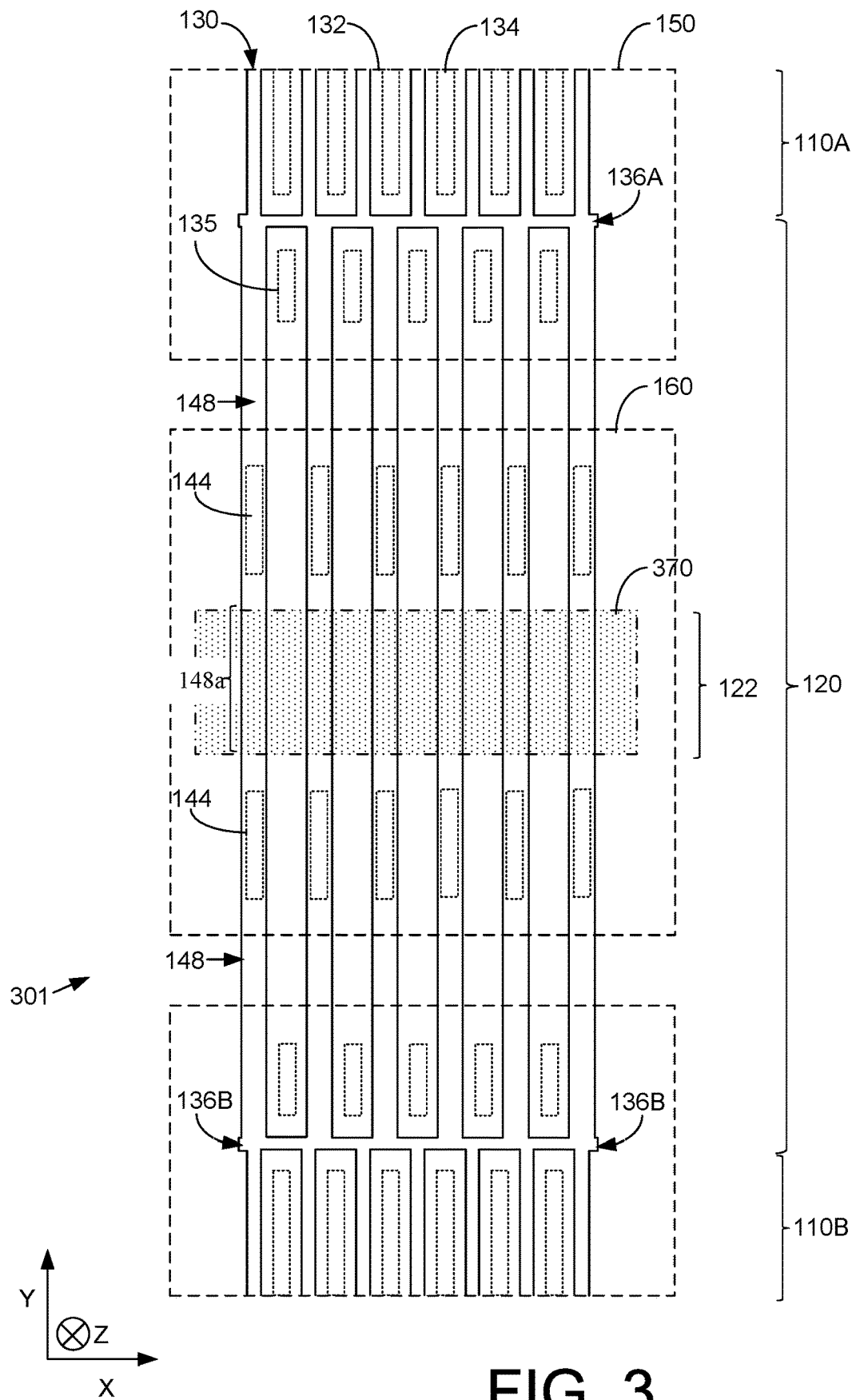
FIG. 3 is an example contact structure layout of a device configured for internal gate feed.

In layout 201, gate termination trench 236, which may be substantially parallel to separation trench 136A, may be disposed in a shield region or section 270 of device 100. The dimensions of shield section 270 may correspond to a mask used in trench MOSFET device fabrication processes, to define an area where the shield conductor is brought up close to the surface of the device. Layout 201 may be used for a gate bus contact area with the shield conductor (e.g., shield poly) terminating an end of the array of all device cells in device 100. Layout 201 may be used at the edge (or top and bottom) of the array of all device cells for a one-sided gate contact. The gate termination arrangement of layout 201 shown in FIG. 1B can be used to establish an external gate feed in device 100. FIG. 3 shows an example contact structure layout 301 of device 100, which is configured for internal gate feed. Example layout 301, like layout 101 (FIG. 1A) includes a gate contact area 120 disposed between two active areas 110 (e.g., active areas 110A, 110B). Active areas 110 include trenches 130 of the first type terminating at separation trenches 136A, 136B. Gate contact area 120 includes a shield section 370 underlying a mid portion 122 of contact area 120 (e.g., about midway) between separation trenches 136A, 136B. The dimensions of shield section 370 may correspond to, for example, a shield mask used in the device fabrication process.

Gate contact area 120 further includes trenches 148 of the second type (like trenches 140 in layout 101) with a first longitudinal end terminating at separation trench 136A and a second longitudinal end terminating at separation trench 136B. Trench 148 may include exposed gate electrode contact elements 144 on either side of shield section 370. The exposed gate electrode contact elements 144 may be in electrical contact with gate metal layer 160. Trench 148 may include a gate runner trench segment 148a between gate electrode contact elements 144 disposed across shield section 370. Gate runner trench segment 148a disposed across shield section 370 may provide an internal gate feed mechanism to the device gates in trenches 148 on either side of the shield section 370. The internal gate feed arrangement of layout 301 can reduce the input capacitance (e.g., Ciss) and reverse transfer capacitance (e.g., Crss) of device 100.

In some implementations, the principle of having different device cell pitches and trench widths in active areas and gate contact areas of device 100 (described herein, for example, with reference to FIG. 1A through FIG. 3) can also be applied to other contact areas (e.g., shield contact areas) of device 100. The principle may be applied to the gate contact area, the shield contact area, or both the gate contact area and the shield contact area of a device.

Figure 4A:
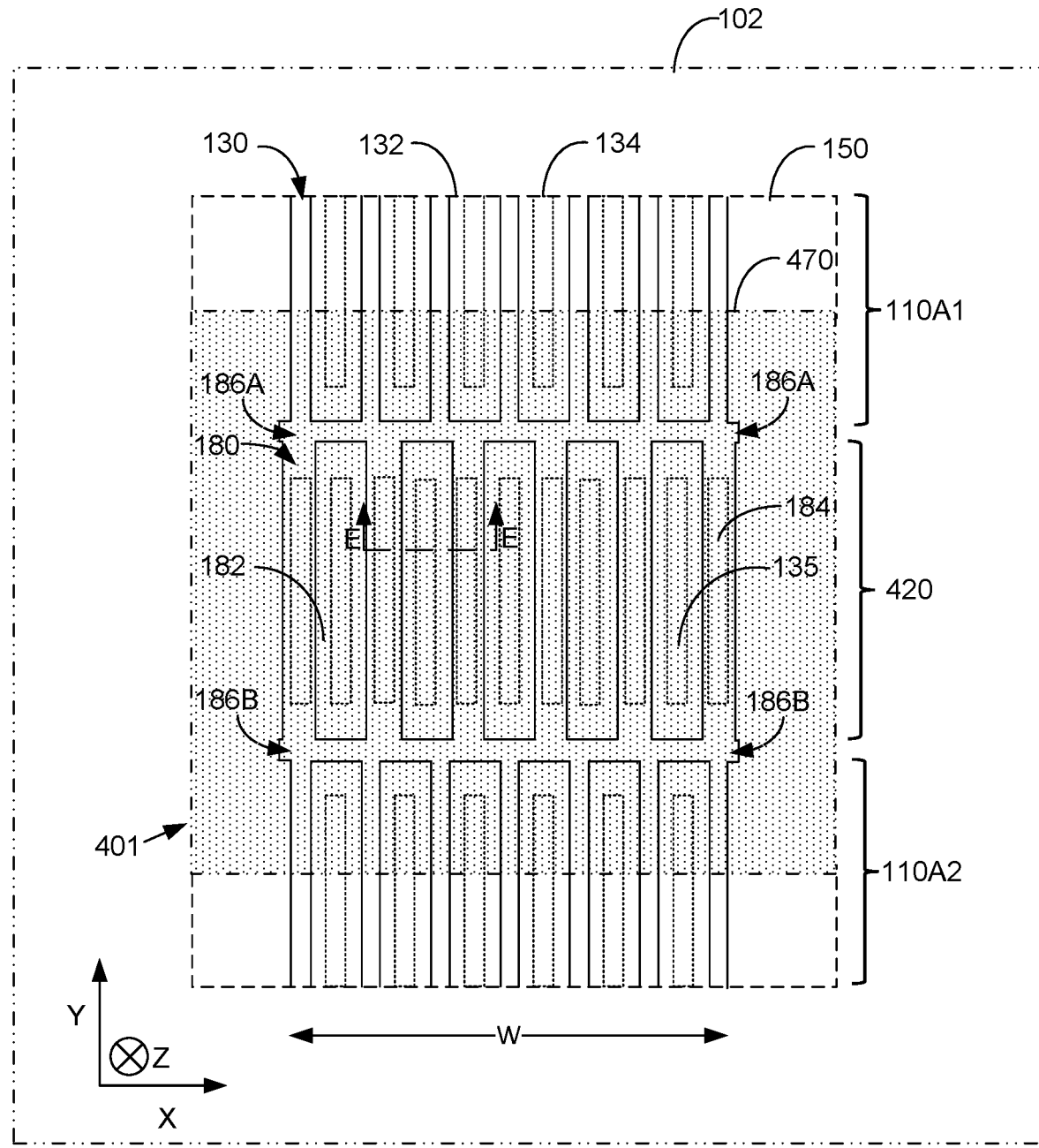
FIG. 4A is an illustration of an example contact structure of device including active areas and a shield contact area.

FIG. 4A shows an example contact structure layout 401 of a portion of device 100 including active areas 110 (e.g., active area 110 A1, 110A2) and a shield contact area 420. Contact structure layout 401 may, for example, further include a gate contact area (not shown) that may be similar to gate contact area 120 described above with reference to FIG. 1A.

In layout 401, each active area 110 (e.g., active area 110 A1, 110A2) is separated from shield contact area 420 by a separation trench (e.g., separation trench 186A, 186B) (aligned with the X direction) formed in semiconductor region 102. Active areas 110 and shield contact area 420 may have about the same width W (in the X direction), for example, along separation trench 186A, 186B. A shield section 470 formed in device 100 may be disposed below shield contact area 420 and/or at least some portions of the active areas 110. The dimensions of shield section 470 may correspond to a poly1 mask used in the device fabrication process.

In layout 401, the active areas 110 (similar to layout 101 shown in at least FIG. 1A) includes a plurality of trenches of a first type (e.g., an array of trenches 130), each of which is aligned perpendicular to and has a first longitudinal end terminating, for example, at separation trench 186A. Each of the plurality of trenches 130 of the first type has a longitudinal length (in the Y direction) and has a width (in the X direction, e.g., width W1$t$, FIG. 1B) aligned parallel to separation trenches 186A, 186B.

Active area mesas 132 are formed between pairs of trenches 130 in active area 110. Each active area mesa 132 may have a width (in the X direction, e.g., width W1$m$, FIG. 1B) aligned parallel to separation trenches 186A, 186B. An active area mesa 132 may include a source contact region or element 134 of device 100 that is exposed in the X-Y plane of the device.

Shield contact area 420 includes a plurality of trenches of a second type (e.g., array of trenches 180), each of which is aligned perpendicular to and has first and second longitudinal ends terminating at separation trenches 186A, 186B.

Each of the plurality of trenches 180 of the second type has a longitudinal length (in the Y direction) and has a width (in the X direction, e.g., width W2$t$, FIG. 4B) aligned parallel to separation trenches 186A, 186B. A trench 180 may include a shield electrode contact element 184 of device 100 that is exposed in the X-Y plane of the device.

Shield contact area mesas 182 are formed between pairs of trenches 180 in shield contact area 420. Each shield contact area mesa 182 may have a width (in the X direction e.g., width W2$m$, FIG. 4B) aligned parallel to separation trenches 186A, 186B. Each shield contact area mesas 182 may include a source or body region contact element 135 of device 100 that is exposed in the X-Y plane of the device.

In example implementations of device 100, a conductive contact layer (e.g., source metal layer 150) may overlay portions of active area 110 to establish to electrical contact with source contact regions or elements 134 of device 100 that are exposed in mesas 132. Source metal layer 150 may also extend over shield contact area 420 to establish electrical contact with source or body region contact elements 135 of device 100 that are exposed in mesas 182. Source metal layer 150 extending over portions of shield contact area 420 may also establish electrical contact with shield electrode contact elements 184 of device 100 that are exposed in trenches 180 in shield contact area 420.

Figure 4B:
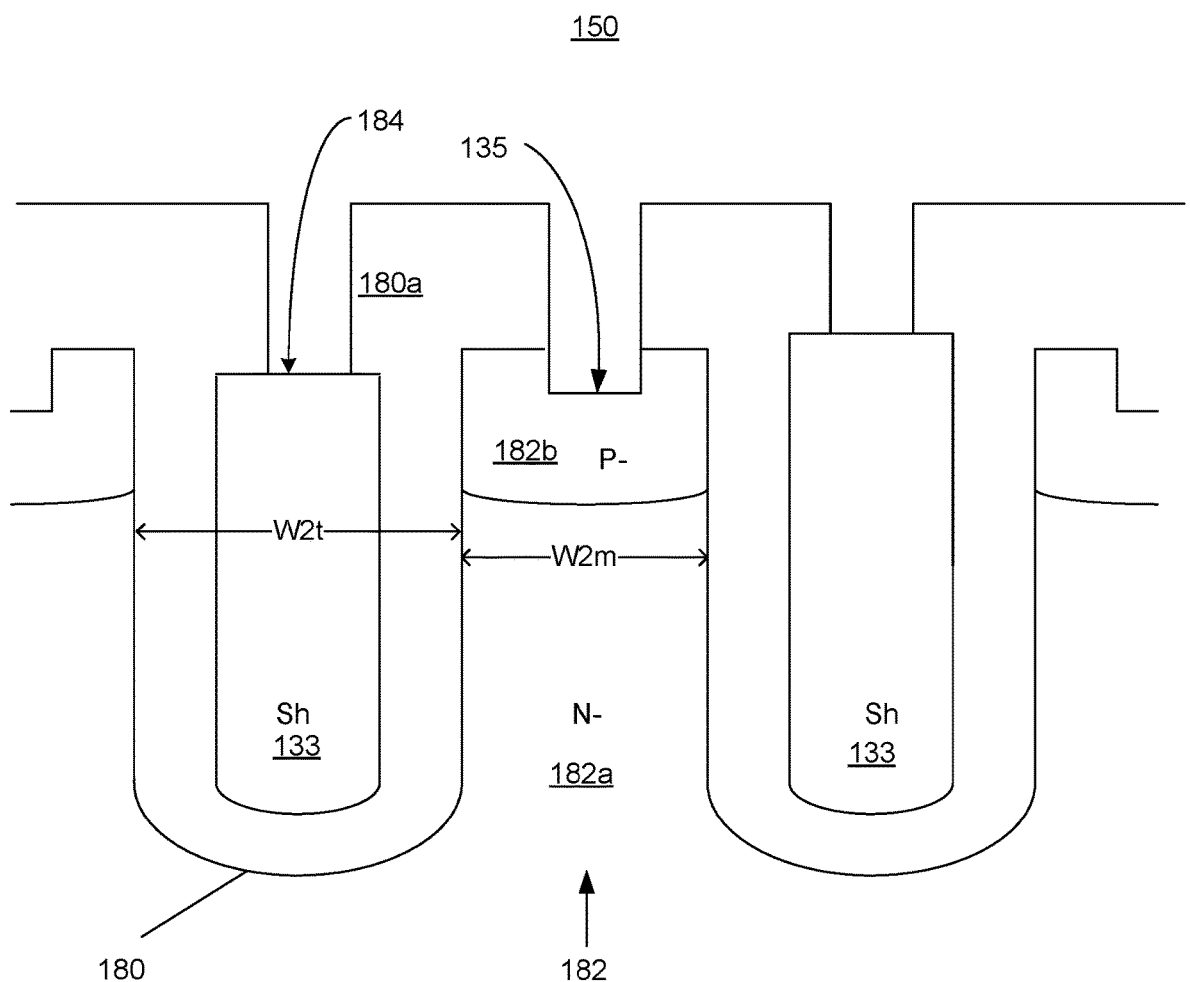
FIG. 4B is an illustration of a cross-sectional view of a portion of the device of FIG. 4A.

FIG. 4B shows a cross-sectional view of a portion of device 100 (taken along line E-E in FIG. 4A) in the Z-Y plane across, for example, two trenches 180 and an intervening mesa 182 in shield contact area 420. As shown in FIG. 4B, in device 100, trench 180 may include a shield electrode 133 and intervening mesa 182 may include a source or body region contact element 135 of device 100 that is exposed in the X-Y plane of the device. Source metal layer 150 is in electrical contact with source or body region contact element 135 in intervening mesa 182. Trench 180 may be filled with insulating material 180a surrounding shield electrode 133. Insulating material 180a may extend over adjoining mesas 182. A trench 180 may include exposed source electrode contact element 184 of device 100 that is also in electrical contact with source metal layer 150, as shown in FIG. 4B.

Further, a mesa 182 (formed between a pair of trenches 180) in the shield contact area of device 100 may include MOSFET device regions such as N– drift region 182a and P– body region 182b. As shown in FIG. 4B, trench 180 may have a width W2t, and mesa 182 may have a width W2m. In example implementation, mesa 142 width W2m may be about the same as mesa 132 width W1m (FIG. 1B), and N– drift region 182a and P– body region 182b and may, for example have the same charge balance and break down characteristics as N– drift region 132a and P– body region 132b (FIG. 1B).

As discussed previously with reference to layout 101 and gate contact area 120 (FIG. 1A), in example implementations of layout 401, a device cell pitch in shield contact area 420 may be increased and made larger than the device cell pitch in the active areas of device 100 (e.g., by including wider trenches (e.g. trenches 180) for making shield contacts, while keeping the mesa widths in shield contact area 420 about the same as the mesa widths in active area 110).

Similar to the gate contact area 120 (FIG. 1A), having the mesa widths in shield contact area 420 the same as the mesa widths in the active area may, for example, allow a similar fabrication of P High Voltage (PHV) body regions in the shield contact areas and active areas in device 100 resulting in similar charge balance and breakdown characteristics (e.g., BVDSS) of device 100 in the active areas and the shield contact areas. The P High Voltage (PHV) body region 182b in a shield contact area mesa 182 may be formed using the same mask and processing step (e.g., implantation, diffusion, etc.) used to form a P High Voltage (PHV) body region in an active area mesa.

Figure 5A:
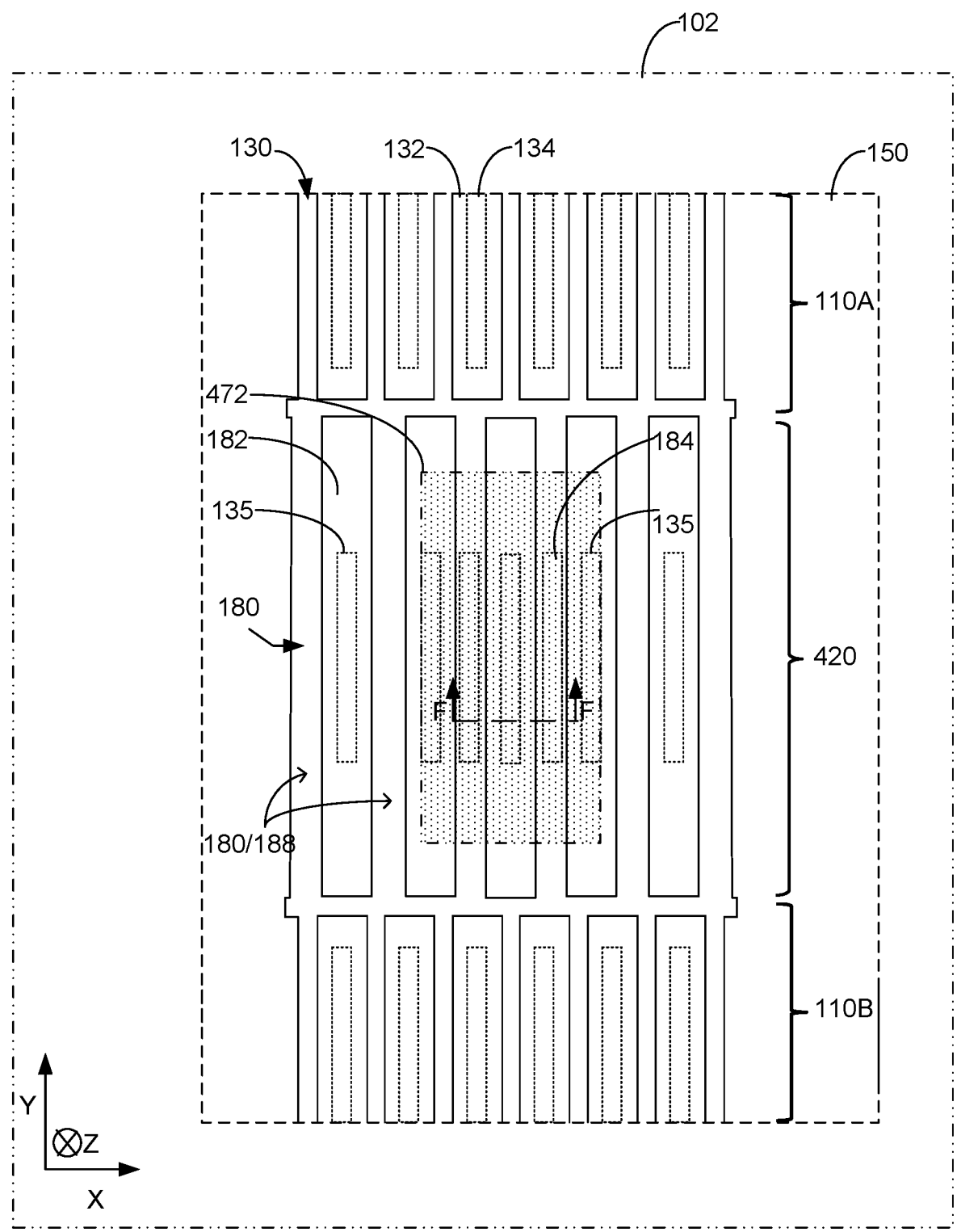
FIG. 5A is an illustration of an example contact structure layout of device that has different device cell pitches and trench widths in an active area and in a shield contact area, and includes gate pass through features.

FIG. 5A shows another example contact structure layout 501 of device 100 having different device cell pitches and trench widths in active area(s) 110 and shield contact area 420, and having gate pass through features.

In example layout 501, active area 110 and shield contact area 420 may have the same geometrical configuration of trenches (i.e., separation trenches 186A, 186B, active area trenches 130, and shield contact area trenches 180) as in layout 401 (FIG. 4A). Contact structure layout 501 may, for example, further include a gate contact area (not shown) that may be similar to gate contact area 120 described above with reference to FIG. 1A.

However, in layout 501, a shield section 472 of device 100 may be smaller in size than shield section 470 of layout 401. Shield section 472 may be disposed below only a portion of shield contact area 420. In an example implementation, shield section 472 may, for example, be disposed below only a central or middle portion of shield contact area 420. In FIG. 5A, shield section 472 is shown, for example, as extending horizontally (in the X direction) across only about two central or middle device cells of the five device cells (i.e., trench 180-mesa 182 cells) shown in shield contact area 420. In other words, a first trench disposed on a first side of a mesa may include a shield contact and a second trench disposed on a second side of the mesa may not include (e.g., may exclude) a shield contact.

In example implementations, a trench 180 that is disposed outside of the shield section 472 can be used as gate pass through trench 188 between active areas (e.g., active areas 110 on either side of shield contact area 420) of device 100. In the example implementations, trenches 180 and mesas 182 that are disposed inside shield section 472 (e.g., in the Y direction) may be used in the same manner as trenches 180 and mesas 182 of layout 401 (FIG. 4A) to make exposed shield electrode contact elements 184 (in trenches 180) and source or body region contact elements 135 (in mesas 182) available for electrical contact with source metal layer 150.

Figure 5B:
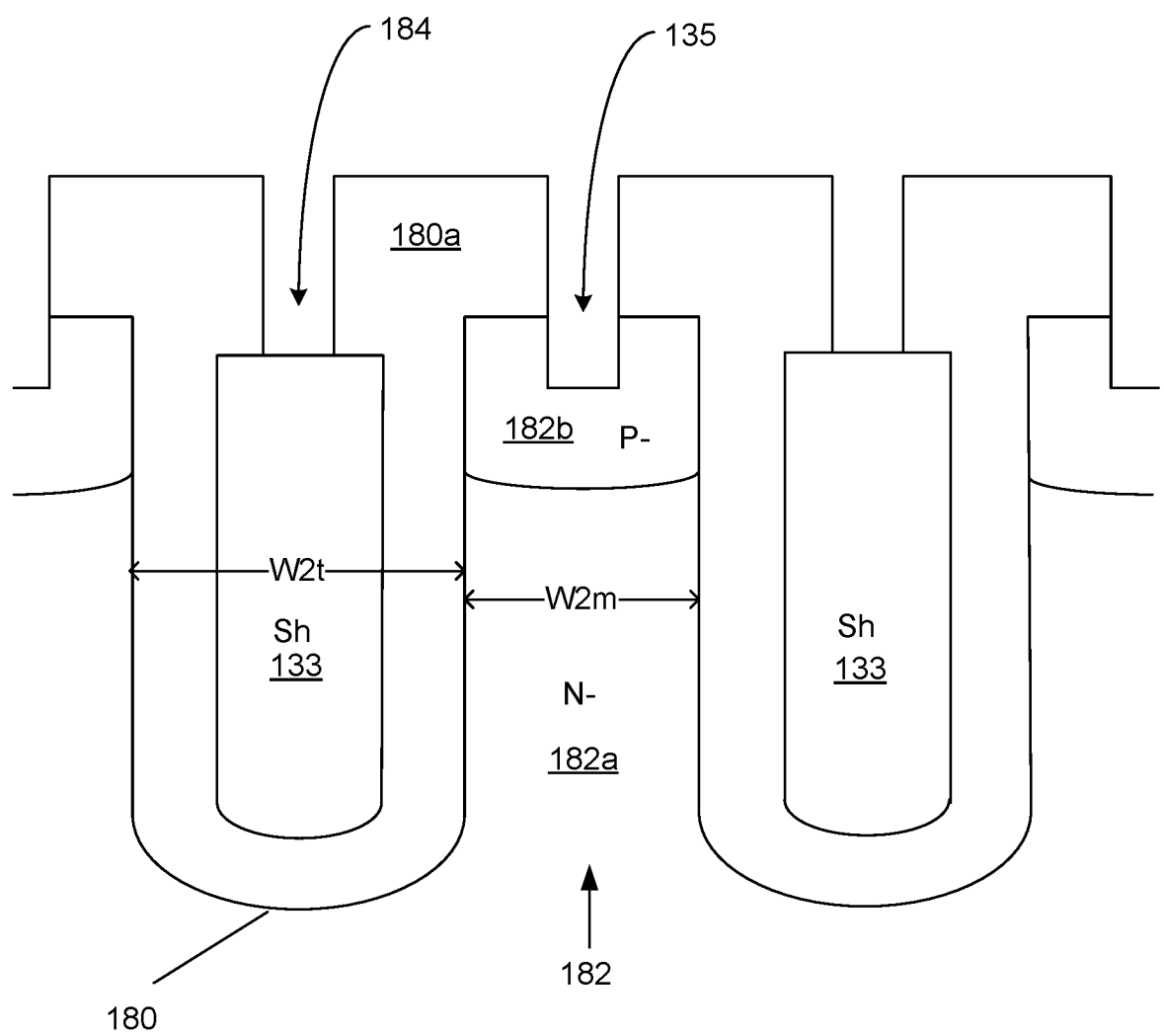
FIG. 5B is an illustration of a cross-sectional view of a portion of the device of FIG. 5A.

FIG. 5B shows a cross-sectional view of a portion of device 100 (taken along line F-F in FIG. 5A) in the Z-Y plane across, for example, two trenches 180 in shield contact area 472. As shown in FIG. 5B, in device 100, trench 180 may include a shield electrode 133. Trench 180 may be filled with insulating material 180a surrounding shield electrode 133. Insulating material 180a may extend over adjoining mesas 182. A trench 180 may include exposed shield electrode contact element 184 of device 100 that is in electrical contact with source metal layer 150. Further, a mesa 182 may include an exposed body region contact element 135 of device 100 that is in electrical contact with source metal layer 150, as shown in FIG. 5B.

FIG. 6 shows an example method 600 for making electrical connections to active elements (e.g., gate electrodes, shield electrodes, source regions, body regions, etc.) of a trench MOSFET device.

Method 600 includes defining a separation trench within a semiconductor region of the device with an active area of the device disposed on a first side of the separation trench, and a contact area disposed on a second side of the separation trench (610). The active area and the contact area may have the same width along a longitudinal direction of the separation trench. The contact area may be a gate contact area or a shield contact area.

Method 600 includes disposing a plurality of trenches of a first type in the active area, each trench of the first type being aligned perpendicular to and having a first longitudinal end terminating at the separation trench, and having a width in the longitudinal direction of the separation trench (620), and disposing a plurality of trenches of a second type in the contact area, each trench of the second type being aligned perpendicular to and having a first longitudinal end terminating at the separation trench, and having a width in a longitudinal direction of the separation trench (630).

Disposing the plurality of trenches of the first type in the active area 620 and disposing the plurality of trenches of the second type in the contact area 630 include disposing a number of the plurality of trenches of the second type in the contact area that is less than the number of the plurality of trenches of the first type disposed in the active area (640).

Further, disposing the plurality of trenches of the first type in the active area 620 and disposing the plurality of trenches of the second type in the contact area 630 include forming an active area mesa between a pair of trenches of the first type in the active area has a width that is substantially the same as the width of a gate contact area mesa formed between a pair of the trenches of the second type in the gate contact area (650).

Method 600 further includes forming a body region (e.g., a P High Voltage (PHV) body region) in the contact area mesa that has a width that is substantially the same as the width of the active area mesa in the active area (660). Forming the P High Voltage (PHV) body region in the contact area mesa may use the same mask and processing step (e.g., implantation, diffusion, etc.) used to form a P High Voltage (PHV) body region in the active area mesa.

Method 600 also includes exposing a device source contact element in the active area mesa and coupling the device source contact element to a source contact conductive layer extending over the active area, and exposing a device body region in the contact area mesa and coupling the exposed device body region to a portion of the source contact conductive layer extending over the contact area (670)

Method 600 includes disposing a number of trenches of the second type in the contact area (per unit width of the contact area) that is less than the number of trenches of the first type disposed in the active area (per unit width of the active area).

Method 600 includes disposing a trench of the second type in the contact area that is wider than a trench of the first type disposed in the active area.

Method 600 includes forming contact area mesas in the contact area between pairs of trenches of the second type and forming active area mesas in the active area between pairs of trenches of the first type, wherein a ratio of the number of contact area mesas in the contact area and the number of active area mesas in the active area is less than one.

When the contact area is a gate contact area, method 600 includes coupling a gate contact element disposed in a trench of the second type to a gate contact conductive layer extending over the gate contact area. The gate contact element connects gate electrode structures (i.e., gate poly and gate oxide) that extend from the active area into the gate contact area through the trench of the second type.

When the contact area is a shield contact area, method 600 includes coupling a shield contact element disposed in a trench of the second type to a source or shield contact conductive layer extending over the shield contact area.

Specific structural and functional details disclosed herein are merely representative for purposes of describing example embodiments. Example embodiments, however, be embodied in many alternate forms and should not be construed as limited to only the embodiments set forth herein.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A contact structure of a device, the contact structure comprising:
   a separation trench defined within a semiconductor region;
   an active area disposed on a first side of the separation trench;
   a gate contact area disposed on a second side of the separation trench;
   a plurality of trenches of a first type disposed in the active area of the semiconductor region, each of the plurality of trenches of the first type being aligned perpendicular to and having a first longitudinal end terminating at the separation trench, each of the plurality of trenches of the first type having a width aligned parallel to the separation trench; and
   a plurality of trenches of a second type disposed in the gate contact area of the semiconductor region, each of the plurality of trenches of the second type being aligned perpendicular to and having a first longitudinal end terminating at the separation trench, each of the plurality of trenches of the second type having a width aligned parallel to the separation trench,
   wherein a number of the plurality of trenches of the second type in the gate contact area terminating on the second side of the separation trench per unit length of the separation trench is less than the number of the plurality of trenches of the first type in the active area terminating on the first side of the separation trench per unit length of the separation trench,
   wherein an active area mesa formed between a pair of trenches of the first type in the active area has a width that is substantially the same as the width of a gate contact area mesa formed between a pair of the trenches of the second type in the gate contact area.

2. The contact structure of claim 1, wherein a ratio of the number of gate contact area mesas in the gate contact area formed between the plurality of trenches of the second type and the number of active area mesas in the active area formed between the plurality of trenches of the first type is less than one.

3. The contact structure of claim 1, wherein the gate contact area mesa that has a width that is substantially the same as the width of the active area mesa in the active area includes a P High Voltage (PHV) body region.

4. The contact structure of claim 1, wherein a device source is exposed in the active area mesa and is coupled to a source contact conductive layer extending over the active area of the semiconductor region, and
   wherein a device body region is exposed in the gate contact area mesa and is coupled to a portion of the source contact conductive layer extending over the gate contact area of the semiconductor region.

5. The contact structure of claim 1, wherein a gate electrode is disposed in one of the trenches of the second type and is coupled to a gate contact conductive layer extending over the gate contact area of the semiconductor region, and wherein the gate electrode disposed in the one of the trenches of the second type extends from, and has the same gate poly and gate oxide structure as a gate electrode in the active area.

6. The contact structure of claim 5, wherein the device includes a shield electrode disposed in the trench below the gate electrode.

7. The contact structure of claim 1, wherein:
   the plurality of trenches of the first type are included in an array of source contact cells at a first cell pitch, each of the source contact cells including one of the plurality of trenches of the first type and an adjacent active area mesa; and
   the plurality of trenches of the second type are arranged as an array of gate contact cells at a second cell pitch, each cell including one of the plurality of trenches of the second type and one adjoining gate contact mesa, the second cell pitch being larger than the first cell pitch.

8. The contact structure of claim 1, wherein at least one of the trenches of the second type is wider and deeper than at least one of the trenches of the first type.

9. The contact structure of claim 1, wherein a first of the trenches of the second type has a different width than a second of the trenches of the second type.

10. The contact structure of claim 1, wherein each of the plurality of trenches of the second type being aligned perpendicular to and having a first longitudinal end terminating at the separation trench has a second longitudinal end terminating at a gate termination trench that is substantially parallel to the separation trench.

11. The contact structure of claim 10, wherein the gate termination trench is configured to establish an external gate feed to the device.

12. The contact structure of claim 1, wherein a trench of the second type disposed in the gate contact area of the semiconductor region and extending from the separation trench includes a gate runner trench segment running across a shield section of the semiconductor region.

13. The contact structure of claim 12, wherein the gate runner trench segment running across the shield section is configured as an internal gate feed mechanism for device gates on either side of the shield section.

14. A contact structure of a device, the contact structure comprising:
   a separation trench defined within a semiconductor region;
   an active area disposed on a first side of the separation trench;
   a shield contact area disposed on a second side of the separation trench;
   a plurality of trenches of a first type disposed in the active area of the semiconductor region, each of the plurality of trenches of the first type being aligned perpendicular to and having a first longitudinal end terminating at the separation trench, each of the plurality of trenches of the first type having a width aligned parallel to the separation trench; and
   a plurality of trenches of a second type disposed in the shield contact area of the semiconductor region, each of the plurality of trenches of the second type being aligned perpendicular to and having a first longitudinal end terminating at the separation trench, each of the plurality of trenches of the second type having a width aligned parallel to the separation trench,
   wherein a ratio of the number of the plurality of trenches of the second type in the shield contact area terminating on the second side of the separation trench and the number of the plurality of trenches of the first type in the active area terminating on the first side of the separation trench is less than one, and
   wherein an active area mesa formed between a pair of trenches of the first type in the active area has a width that is substantially the same as the width of a shield contact area mesa formed between a pair of the trenches of the second type in the shield contact area.

15. The contact structure of claim 14, wherein a shield contact element is disposed in a trench of the second type in the shield contact area and is coupled to a source contact conductive layer extending over the shield contact area of the semiconductor region.

16. The contact structure of claim 14, wherein a device source is exposed in the active area mesa and or the shield contact area mesa, and is coupled to the source contact conductive layer.

17. The contact structure of claim 14, wherein the plurality of trenches of the second type in the shield contact area includes a gate pass-through trench.

18. A method, comprising:
defining a separation trench within a semiconductor region of a device with an active area of the device disposed on a first side of the separation trench and a contact area disposed on a second side of the separation trench, the active area and the contact area having a same width in a longitudinal direction of the separation trench;
disposing a plurality of trenches of a first type in the active area and disposing a plurality of trenches of a second type in the contact area, each of the trench of the first type being aligned perpendicular to and having a first longitudinal end terminating at the separation trench, and having a width in the longitudinal direction of the separation trench; and
disposing a plurality of trenches of a second type in the contact area, each of the trench of the second type being aligned perpendicular to and having a first longitudinal end terminating at the separation trench, and having a width in a longitudinal direction of the separation trench,
wherein a ratio of the number of the plurality of trenches of the second type in the contact area terminating on the second side of the separation trench and the number of the plurality of trenches of the first type in the active area terminating on the first side of the separation trench is less than one, and
wherein an active area mesa formed between a pair of trenches of the first type in the active area has a width that is substantially the same as the width of a gate contact area mesa formed between a pair of the trenches of the second type in the gate contact area.

19. The method of claim 18, further comprising:
forming a P High Voltage (PHV) body region in the contact area mesa that has a width that is substantially the same as the width of the active area mesa in the active area.

20. The method of claim 18, further comprising:
exposing a device source contact element in the active area mesa and coupling the device source contact element to a source contact conductive layer extending over the active area; and
exposing a device body region in the contact area mesa and coupling the exposed device body region to a portion of the source contact conductive layer extending over the contact area.

* * * * *